United States Patent
Morikawa

(10) Patent No.: US 6,559,514 B2
(45) Date of Patent: *May 6, 2003

(54) SEMICONDUCTOR MEMORY DEVICE HAVING AUXILIARY CONDUCTION REGION OF REDUCED AREA

(75) Inventor: Yoshinao Morikawa, Nara (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/548,888

(22) Filed: Apr. 13, 2000

(65) Prior Publication Data

US 2002/0175349 A1 Nov. 28, 2002

(30) Foreign Application Priority Data

Jul. 7, 1999 (JP) .......................... 11-193786

(51) Int. Cl.[7] .................. H01L 29/06; G11C 11/413; G11C 5/02; G11C 5/06
(52) U.S. Cl. ................. 257/499; 365/51; 365/63; 365/104; 365/182; 365/230.03
(58) Field of Search ............. 365/51, 63, 94, 365/103, 104, 230.01, 230.03, 182; 257/499

(56) References Cited

U.S. PATENT DOCUMENTS 5,202,848 A * 4/1993 Nakagawara ........... 365/104
5,930,195 A * 7/1999 Komatsu ........... 365/230.03

FOREIGN PATENT DOCUMENTS

| JP | 4-311900 | * 11/1992 | ........... 365/103 |
| JP | 6104406 | 4/1994 | |
| JP | 09-06 4305 | 3/1997 | |
| JP | 9-331030 | * 12/1997 | |
| JP | 11-135650 | * 5/1999 | |

* cited by examiner

Primary Examiner—Eddie Lee
Assistant Examiner—Marcos D. Pizarro-Crespo
(74) Attorney, Agent, or Firm—Morrison & Foerster LLP

(57) ABSTRACT

A semiconductor memory device includes a semiconductor substrate; a plurality of word lines provided on the semiconductor substrate and arranged in parallel to each other; a plurality of memory cells provided along each of the plurality of word lines; a plurality of sub bit lines provided on the semiconductor substrate and arranged in parallel to each other, each of the plurality of word line intersecting the plurality of sub bit lines; a plurality of main bit lines arranged in parallel to the plurality of sub bit lines; a plurality of bank select lines arranged in parallel to the plurality of word lines; a plurality of bank select transistors provided along each of the plurality of bank select lines and connected to the respective sub bit lines; and a plurality of auxiliary conduction regions provided for each of the plurality of the main bit lines, connecting each of the plurality of the main bit lines to a set of the plurality of bank select transistors of the plurality of sub bit lines. The shape of the plurality of bank select transistors is the same. Each of the plurality of auxiliary conduction regions has a modified-H shape including a central portion connected to each of the plurality of main bit lines and branch portions each connected to a corresponding one of the set of the plurality of bank select transistors of the plurality of sub bit lines.

10 Claims, 6 Drawing Sheets

SEMICONDUCTOR MEMORY DEVICE HAVING AUXILIARY CONDUCTION REGION OF REDUCED AREA

BACKGROUND OF THE INVENTION

1. Field of the Invention

The present invention relates to a semiconductor memory device, and more particularly to a semiconductor memory device with a hierarchical bit line architecture having main and sub bit lines.

2. Description of the Related Art

Mask Read Only Memory (MROM) is a conventional semiconductor memory device which adopts a hierarchical bit line architecture. MROM includes a memory cell structure having two transistors (MOSFET) with different level threshold levels so as to store a binary digit. One of the two transistors has a low threshold level, i.e., a low voltage applied to the gate electrode can cause a sufficient current to flow through the transistor. The other has a high threshold level such that only a sufficiently high voltage applied to the gate electrode allows the current flow. The use of two transistors having low and high threshold levels, respectively, can realize the binary memory. The hierarchical bit line architecture is used to read the value of the binary digit stored in the corresponding transistor, and to integrate the memory cells in high density.

FIG. 2 is a circuit diagram representing an MROM with a hierarchical bit line architecture. As shown in FIG. 2, main bit lines MB1, MB2, . . . , etc. and sub bit lines SB1, SB2, . . . , etc. are arranged in a hierarchical structure. For example, the main bit line MB1 is disposed between the odd-numbered sub bit line SB1 and the even-numbered sub bit line SB2. One of memory cells M1, M2, . . . , etc., which includes a transistor, is disposed each between the adjacent two sub bit lines. The source of each of the memory cells M1, M2, . . . , etc. is connected to one of the adjacent two sub bit lines and the drain is connected to the other. The gates of the memory cells are connected to word lines WL0, . . . , WLn. The main bit lines MB1, MB2, . . . etc. are connected to sense circuits SA1, SA2, . . . , etc., respectively, and a charging circuit Ca, or are otherwise connected via transistors (MOSFET) Q1, Q2, . . . , etc. to GND. Each odd-numbered sub bit line is connected via a bank select transistor (MOSFET) BK1 or BK2 to a main bit line. The gates of the bank select transistors (MOSFET) BK1 and BK2 are connected to bank select lines BKL1 and BKL2, respectively. Each even-numbered sub bit line is connected via a bank select transistor (MOSFET) BK3 or BK4 to a main bit line. The gates of the bank select transistors BK3 and BK4 are connected to bank select lines BKL3 and BKL4, respectively.

In order to read the value of the memory cell M4, for example, the bank select line BKL1 is activated so that the bank select transistor BK1 is switched ON while the bank select line BKL3 is activated so that the bank select transistor BK3 is switched ON. This leads to formation of a current path from the charging circuit Ca to the main bit line MB1 to the bank select transistor BK1 to the sub bit line SB3. When the threshold of the memory cell M4 is set to a low value, the activated word line WL0 switches ON the memory cell M4. This allows a current to flow from the sub bit line SB3, to the memory cell M4, to the sub bit line SB4, to the bank select transistor BK3, to the main bit line MB2, to the transistor Q1, to GND. On the other hand, when the threshold of the memory cell M4 is set to a high value, the activated word line WL0 leaves the memory cell M4 OFF. This does not allow a current to flow in the above-described path. The sense circuit SA1 reads the binary digit stored in the memory cell M4 by determining whether a current flows through the path or not.

FIG. 3 is a diagram illustrating a layout design of the semiconductor substrate on which the MROM shown in FIG. 2 is provided.

In FIG. 3, a channel region Ch is provided in each of the bank select transistors BK1, BK2, . . . , etc. An auxiliary conduction region (diffusion region) H is connected via each of the bank select transistors BK1, BK2, . . . , etc. to each of the sub bit lines SB1, SB2, . . . , etc. Each of the bank select transistors BK1, BK2, . . . , etc. is connected via a contact hole CC of the corresponding auxiliary conduction region H to each of the main bit lines MB1, MB2, . . . , etc. The word lines WL0, . . . , WLn intersect the sub bit lines SB1, SB2, . . . , etc.

The main bit lines MB1, MB2, . . . , etc. are made of a low resistance material such as metal. The sub bit lines SB1, SB2, . . . , etc. are formed of a diffusion layer which enables formation of the source and drain of a transistor. Each memory cell uses two adjacent sub bit lines as a source electrode and a drain electrode, respectively, and one of the word lines WL0, . . . , WLn as a gate electrode in a way shown in FIG. 3.

Here the bank select transistors BK1, BK2, etc. each have channel region Ch having a large width w2. The large-width channel regions Ch increase current flowing from the charging circuit to the memory cells M1, M2, . . . , etc. to GND, and the increased current can improve the performance of the bank select transistors BK1, BK2, . . . , etc. This leads to high-speed reading of data from the memory cells M1, M2, . . . , etc.

As shown in FIG. 3, the channel regions Ch of two adjacent bank select line s BK1, BK2, . . . , etc. face each other. For example, the channel region Ch of the bank select line BK1 faces the channel region Ch of the bank select line BK2. The channel region Ch of the bank select line BK3 faces the channel region Ch of the bank select line BK4. The width b between the bank select transistors, e.g. , between BK1 and BK2 or between BK3 and BK4, is required to sufficiently isolate the bank selects transistors. The sufficient width b leads to an increase in the width a of a memory array, resulting in a large-sized chip.

To solve such a problem, Japanese Laid-Open Publication No. 6-104406 discloses an MROM which has a circuit structure and layout design as shown in FIGS. 4 and 5, respectively. Like numeral references refer to like parts in FIGS. 2 through 5.

As is apparent from FIG. 4, bank select transistors BK2-1 and BK2-2 are connected to each other in parallel and bank select transistors BK3-1 and BK3-2 are connected to each other in parallel. Each of the bank select transistors BK2-1 and BK2-2 has the same current supply performance (current amount per unit area) as that of the bank select transistor BK2 shown in FIG. 2. Each of the bank select transistors BK3-1 and BK3-2 has the same current supply performance as that of the bank select transistor BK3 shown in FIG. 2.

As is apparent from FIG. 5, the auxiliary conduction regions H (diffusion region) each have an H-shape. A sub bit line SB1 is connected to an auxiliary conduction region H via the bank select transistors BK2-1 and BK2-2. Similarly, sub bit line SB2 is connected to an auxiliary conduction region H via the bank select transistor BK4. Sub bit line SB3 is connected to an auxiliary conduction region H via the bank select transistor BK1. Sub bit line SB4 is connected to an auxiliary conduction region H via the bank select transistors BK3-1 and BK3-2. The auxiliary conduction regions H each are connected via a contact hole CC of an insulating layer (not shown) to one of the main bit lines MB1, MB2, . . . , etc.

Here the width w1 of the channel region Ch of each of the bank select transistors BK2-1 and BK2-2 and the bank select transistors BK3-1 and BK3-2 is smaller than the width w2 of the channel region Ch of each of the bank select transistors BK2 and BK3 shown in FIG. 3. This prevents an increase in chip size.

The width W1 of the channel region Ch of each of the bank select transistors BK2-1 and BK2-2 may be small. However, when the sum of the widths w1 of the channel regions Ch of the bank select transistors BK2-1 and BK2-2 (i.e., w1+w1) is equal to the width w2 of the channel region Ch of the bank select transistor BK2 shown in FIG. 3 (w1+w1=w2), the bank select transistors BK2-1 and BK2-2 provide the same amount of current flow as that of the bank select transistor BK2 shown in FIG. 3. The same applies to the relationship between the bank select transistors BK3-1 and BK3-2 and the bank select transistor BK3 shown in FIG. 3.

Even when the relationship w1+w1=w2 is satisfied in the layout design shown in FIG. 5, the relationship does not hold in the actual LSI due to the microstructure. In this case, the bank select transistors BK2-1 and BK2-2 shown in FIG. 4 do not have the same current supply performance as that of the bank select transistor BK2 shown in FIG. 3. The bank select transistors BK3-1 and BK3-2 shown in FIG. 4 do not have the same current supply performance as that of the bank select transistor BK3 shown in FIG. 2. This is because the effective width of the channel region Ch of a bank select transistor is smaller in the actual LSI than in the layout design. In other words, the width of the channel region Ch of the bank select transistor in the layout design includes an ineffective width which does not function as the channel region Ch. This ineffective width does not depend on the gate width when the gate length is constant.

FIG. 6 shows a channel region Ch of a bank select transistor between two sub bit lines SB. FIG. 6 also shows the relationship between the width w1 of the channel region Ch in a layout design and the effective and ineffective widths w6 and w4 of the channel region Ch in the actual LSI (w6=w1−2×w4).

Taking the relationship into consideration, the sum $W_{eff0}$ of the effective widths of the channel region ch of the bank select transistors BK2-1 and BK2-2 is represented by the following equation: $W_{eff0}=(w1-2\times w4)+(w1-2\times w4)=2\times w1-4\times w4$. The effective width $W_{eff0}$ of the channel region Ch of the bank select transistor BK2 shown in FIG. 3 is represented by the following equation: $W_{eff1}=w2-2\times w4=2\times w1-2\times w4$ where w2 is the width of the channel region Ch of the bank select transistor BK2 in the layout design (=2×w1). Since the ineffective width w4 is constant as described above, the sum $W_{eff0}$ of the effective widths of the channel region oh of the bank select transistors BK2-1 and BK2-2 shown in FIG. 5 is smaller than the effective width $W_{eff1}$ of the channel region Ch of the bank select transistor BK2 shown in FIG. 3. Moreover, the value (w1+w1=w2) defined in the layout design often does not hold in the actual LSI due to variations in the width w1. For these reasons, the combinations of the bank transistors BK2-1 and BK2-2 as well as BK3-1 and BK3-2 have reduced current supply performance.

The width w1 of the channel region Ch in the layout design can be defined to allow for the ineffective width w4. The ineffective width w4 varies depending on the manufacturing conditions of the actual LSI, so that it is difficult to control the effective width w6. Variations in the bank select transistors cause the reading speed of the memory cell to vary among the bank select transistors through which the value in a memory cell is read out. For this reason, a stable and fast reading cannot be established.

Furthermore, the auxiliary conduction region H has a parasitic capacitance. As is apparent from the layout design shown in FIG. 5, the auxiliary conduction region H is H-shaped. The large area of the auxiliary conduction region H leads to an increase in the parasitic capacitance of the main bit line. This results in the slow speed at which the memory cell value is read out.

SUMMARY OF THE INVENTION

According to one aspect of the present invention, a semiconductor memory device includes a semiconductor substrate; a plurality of word lines provided on the semiconductor substrate and arranged in parallel to each other; a plurality of memory cells provided along each of the plurality of word lines; a plurality of sub bit lines provided on the semiconductor substrate and arranged in parallel to each other, each of the plurality of word line intersecting the plurality of sub bit lines; a plurality of main bit lines arranged in parallel to the plurality of sub bit lines; a plurality of bank select lines arranged in parallel to the plurality of word lines; a plurality of bank select transistors provided along each of the plurality of bank select lines and connected to the respective sub bit lines; and a plurality of auxiliary conduction regions provided for each of the plurality of the main bit lines, connecting each of the plurality of the main bit lines to a set of the plurality of bank select transistors of the plurality of sub bit lines. The shape of the plurality of bank select transistors is the same. Each of the plurality of auxiliary conduction regions has a modified-H shape including a central portion connected to each of the plurality of main bit lines and branch portions each connected to a corresponding one of the set of the plurality of bank select transistors of the plurality of sub bit lines.

In one embodiment of this invention, each of the plurality of auxiliary conduction regions has four branch portions and has a modified-H shape.

In one embodiment of this invention, two of the four branch portions are smaller than the others.

In one embodiment of this invention, the semiconductor substrate is of a first conductivity type and the plurality of sub bit lines are a second conductivity type diffusion layer.

In one embodiment of this invention, each of the plurality of memory cells has one of the plurality of sub bit lines as a source and a drain and one of the plurality of word lines as a gate electrode.

In one embodiment of this invention, each of the plurality of main bit lines is made of a low resistance metal material.

According to another aspect of the present invention, a semiconductor memory device includes a semiconductor substrate; a plurality of word lines provided on the semiconductor substrate and arranged in parallel to each other; a plurality of memory cells provided along each of the plurality of word lines; a plurality of sub bit lines provided on the semiconductor substrate and arranged in parallel to each other, each of the plurality of word line intersecting the plurality of sub bit lines; a plurality of main bit lines arranged in parallel to the plurality of sub bit lines; a plurality of bank select lines arranged in parallel to the plurality of word lines; a plurality of bank select transistors provided along each of the plurality of bank select lines and connected to the respective sub bit lines; and a plurality of auxiliary conduction regions provided for each of the plurality of the main bit lines, connecting each of the plurality of the main bit lines to a set of the plurality of sub bit lines. The plurality of bank select transistors provided along one of the plurality of bank select lines and the plurality of bank select transistors provided along another of the plurality of bank select lines adjacent to the one of the plurality of bank select lines are alternately arranged and protrude inwardly between the one and another of the plurality of word lines.

In one embodiment of this invention, the semiconductor substrate is of a first conductivity type and the plurality of sub bit lines are a second conductivity type diffusion layer.

In one embodiment of this invention, each of the plurality of memory cells has one of the plurality of sub bit lines as a source and a drain and one of the plurality of word lines as a gate electrode.

In one embodiment of this invention, each of the plurality of main bit lines is made of a low resistance metal material.

Thus, the invention described herein makes possible the advantage of providing a semiconductor memory device providing stable high-speed reading without an increase in chip size.

This and other advantages of the present invention will become apparent to those skilled in the art upon reading and understanding the following detailed description with reference to the accompanying figures.

DESCRIPTION OF THE PREFERRED EMBODIMENTS

Figure 1:
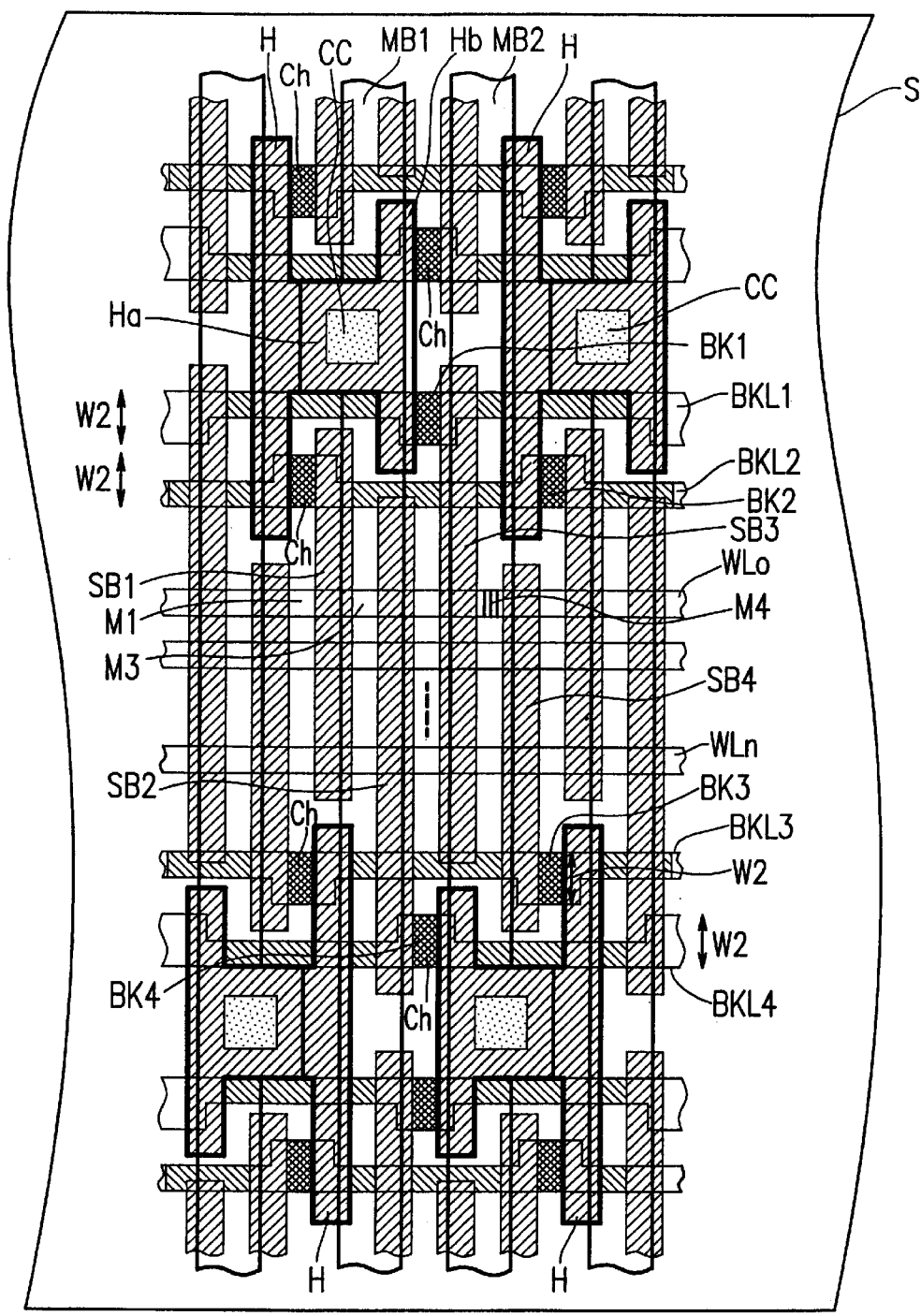
FIG. 1 is a diagram showing a layout design of a semiconductor memory device according to an example of the present invention.
Figure 2:
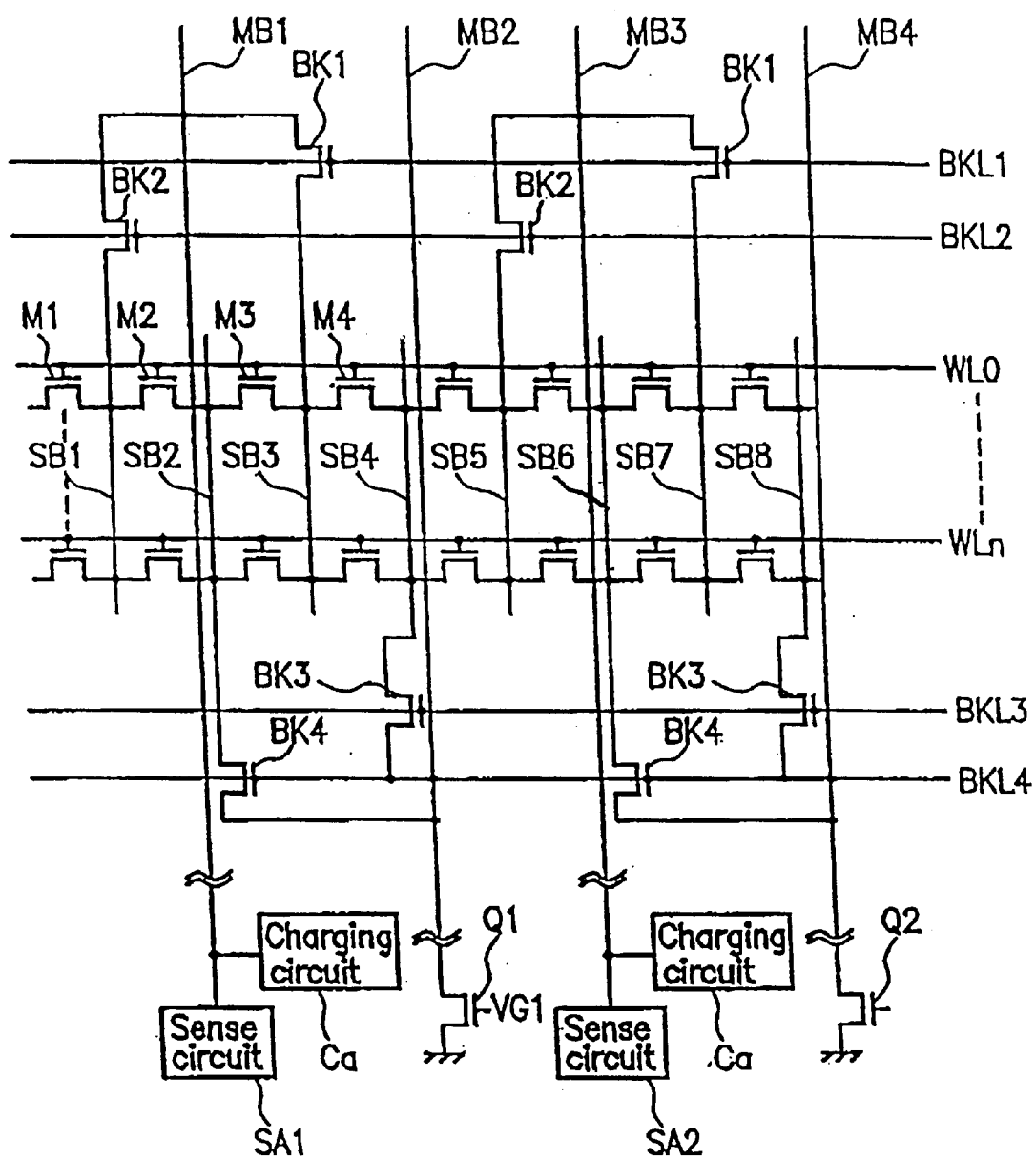
FIG. 2 is a circuit diagram illustrating an MROM with a hierarchical bit line architecture.
Figure 3:
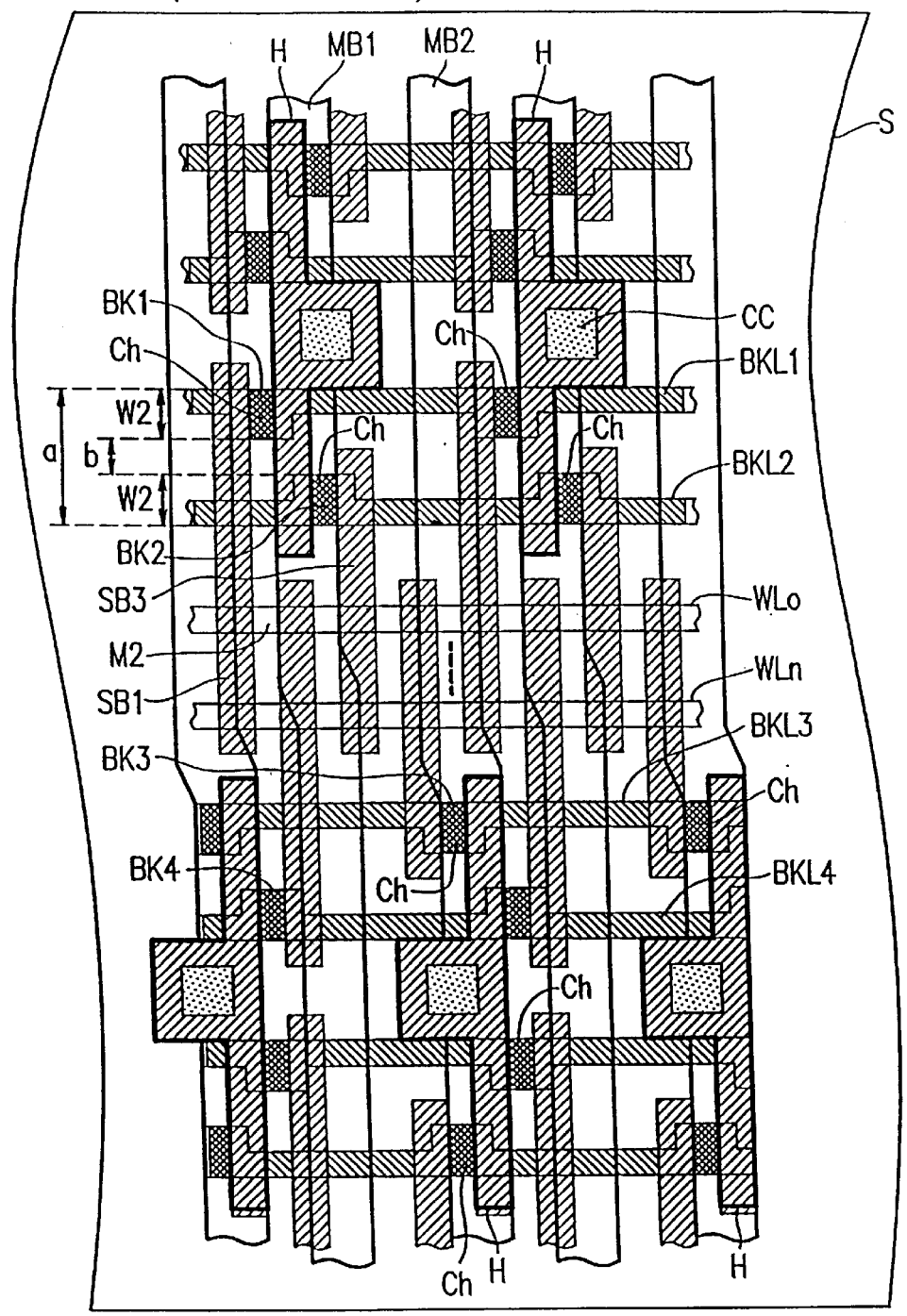
FIG. 3 is a diagram illustrating a conventional layout design of the semiconductor substrate in which the MROM shown in FIG. 2 is provided.
Figure 3:
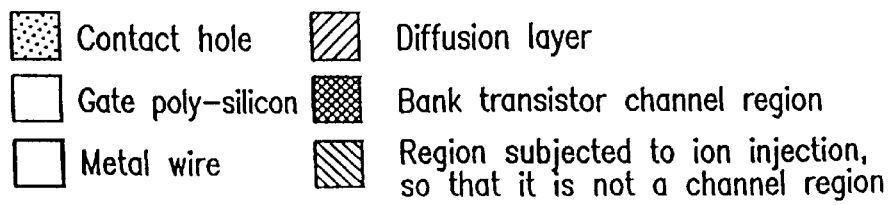
Figure 4:
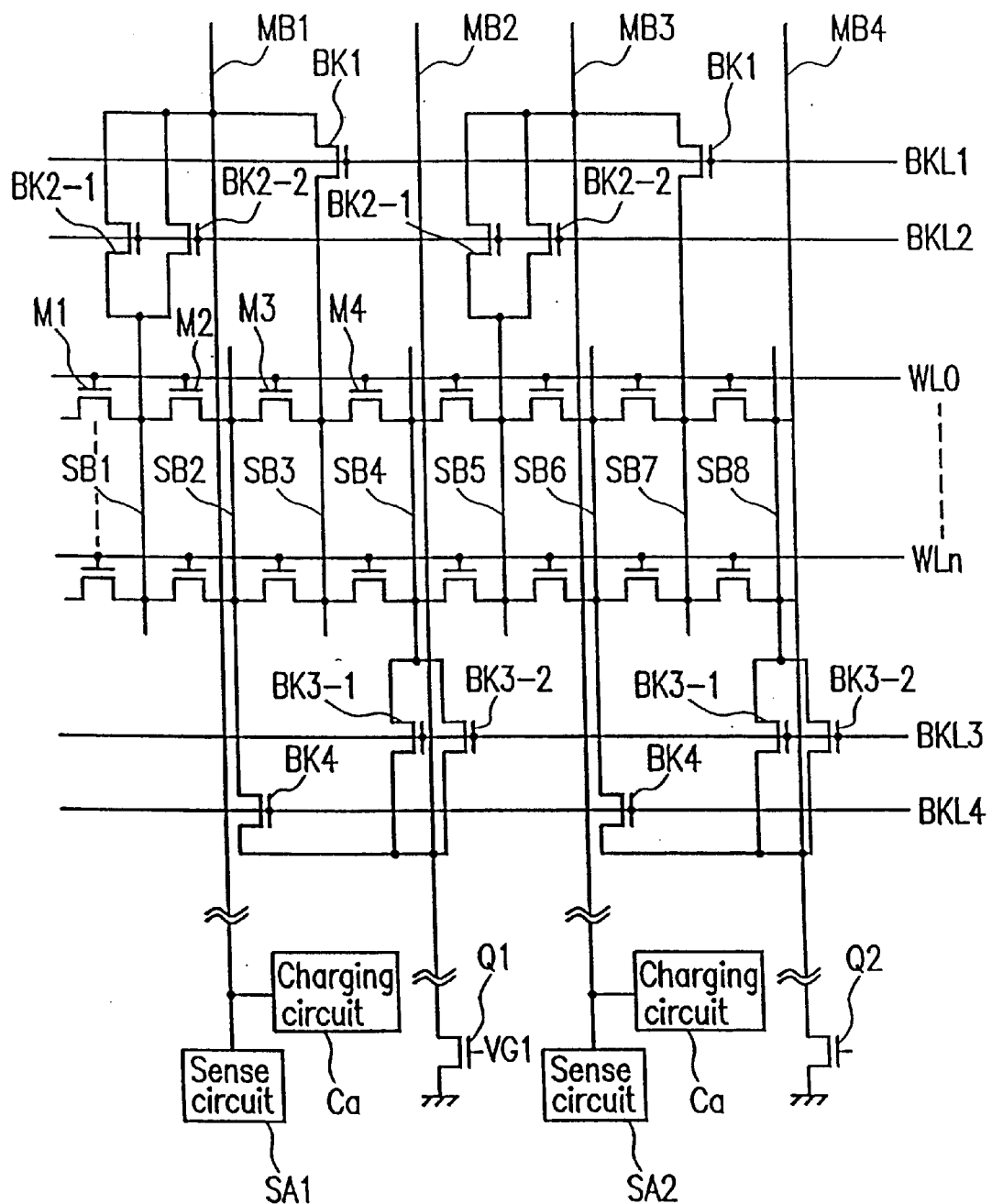
FIG. 4 is a circuit diagram illustrating another MROM with a hierarchical bit line architecture.

FIG. 1 is a layout design of a semiconductor memory device according to an example of the present invention. The semiconductor memory device is an MROM having a hierarchical bit line architecture. FIG. 2 discussed above, also represents a circuit diagram of the semiconductor memory device according to the present invention.

As shown in FIG. 1, the semiconductor memory device includes word lines WL0, ..., WLn, which are arranged in parallel to each other, and memory cells M1, M2, ..., etc. which are arranged along each word line. Sub bit lines SB1, SB2, ..., etc. are arranged to intersect each of the word lines WL0, ..., WLn and be parallel to each other. Main bit lines MB1, MB2, ..., etc. are arranged to intersect each of the word lines WL0, ..., WLn and be parallel to each other. Bank select lines BKL1, BKL2, BKL3, BKL4, ..., etc. are arranged in parallel to the word lines WL0, ..., WLn. Bank select transistors BK1, BK2, BK3, BK4, ..., etc. are formed on the bank select lines BKL1, BKL2, BKL3, BKL4, ..., etc., respectively.

An auxiliary conduction region (diffusion region) H is modified-H- shaped and has a central portion Ha which is connected via a contact hole CC to one of the main bit lines MB1, MB2, ..., etc. and a branch portion Hb which is connected to one of the bank select transistors BK1, BK2, BK3, BK4, ..., etc. Thus, the bank select transistors BK1, BK2, BK3, BK4, ..., etc. are connected via the auxiliary conduction region (diffusion region H) to the corresponding main bit line.

A semiconductor substrate of the semiconductor memory device is of a first conductive type (e.g., p-type or p-well). The sub bit lines SB1, SB2, ..., etc. are formed of a diffusion layer of a second conductivity type (e.g., n-type) which enables formation of the source and drain of a transistor. The memory cells M1, M2, ..., etc. each use two adjacent sub bit lines SB1, SB2, ..., etc. as a source and a drain, and one of the word lines WL0, ..., WLn as a gate electrode. The main bit lines MB1, MB2, etc. are formed of a low resistance material such as metal.

The bank select transistor BK1 of the bank select line BKL1 and the bank select transistor BK2 of the bank select line BKL2 are alternately arranged in such a manner that the channel regions Ch of the bank select transistors BK1 and BK2 protrude inwardly between the bank select lines BKL1 and BKL2. Similarly, the bank select transistor BK3 of the bank select line BKL3 and the bank select transistor BK4 of the bank select line BKL4 are alternately arranged in such a manner that the channel regions Ch of the bank select transistors BK3 and BK4 protrude inwardly between the bank select lines BKL3 and BKL4.

In such a layout design, the width w2 of the channel region Ch of each of the bank select transistors BK1, BK2, BK3, BK4, ..., etc. is large while the bank select lines BKL1 and BKL2 are arranged close to each other and the bank select lines BKL3 and BKL4 are arranged close to each other. This arrangement prevents an increase in chip size while the current supply performance of the bank select transistors BK1, BK2, BK3, and BK4 is not degraded and the speed of reading data from the memory cell is not lowered. Moreover, the bank select transistors BK1, BK2, BK3, BK4, ..., etc. have the same shape and size. Therefore, the speed of reading data from the memory cell is the same regardless of through which bank select transistor the data is transferred. Stable high-speed reading can be obtained.

Figure 5:
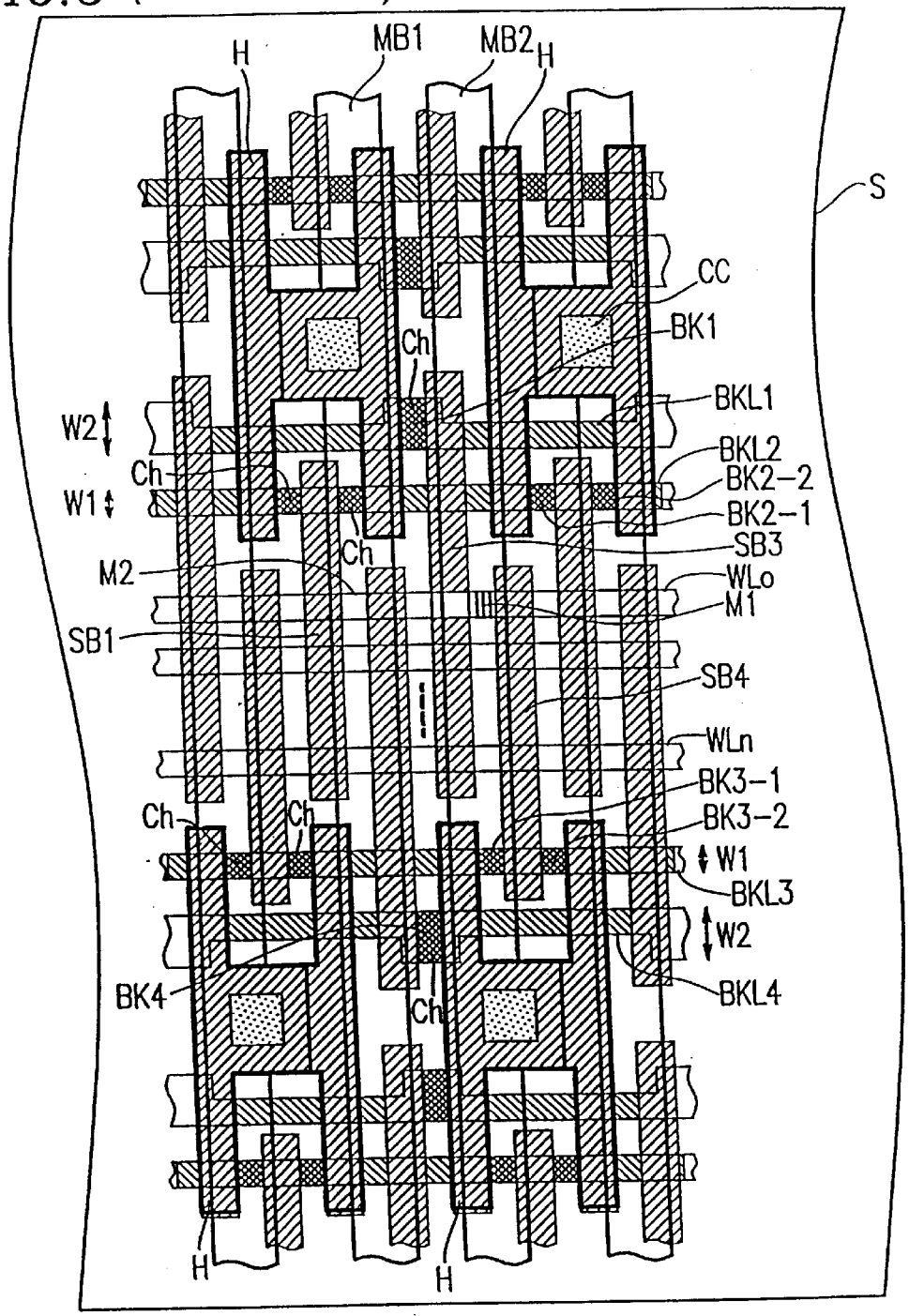
FIG. 5 is a diagram illustrating a conventional layout design of the semiconductor substrate in which the MROM shown in FIG. 4 is provided.
Figure 6:
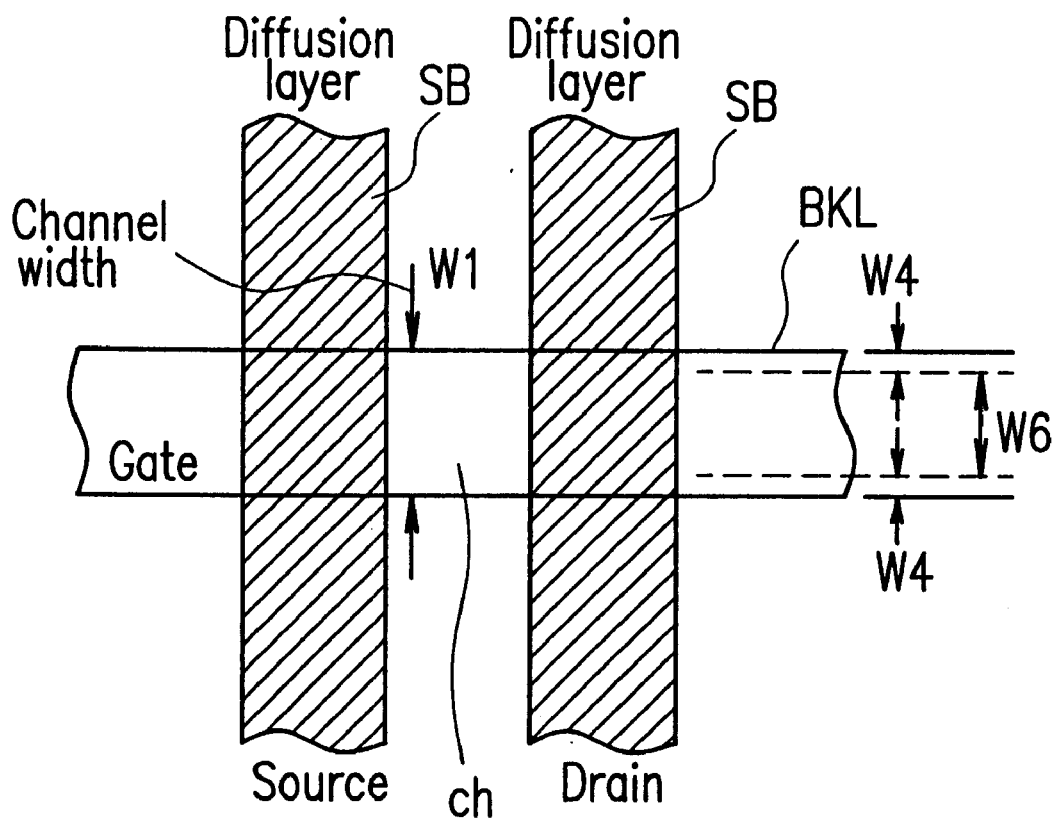
FIG. 6 is a diagram illustrating a channel region of a bank select transistor between two sub bit lines.

Each auxiliary conduction region H has four branch regions Hb, two of which are shorter than the others. Thus, the area of each auxiliary conduction region H is smaller compared with the auxiliary conduction region H of the conventional semiconductor memory device shown in FIG. 5. The smaller area of the auxiliary conduction region H has a reduced parasitic capacitance for the corresponding main bit line, resulting in high-speed reading of data from the memory cell.

For instance, when the semiconductor memory device has a configuration such that data is read from four memory cells via one main bit line and one bank includes 32 memory cells, there are 64 modified-H-shaped auxiliary conduction regions H in the device. All the parasitic capacitances of these auxiliary conduction regions H add up as the capacitances of the main bit lines. The capacitances of the main bit lines have adverse influences on the speed of reading data from the memory cells. To avoid this, a small area and short circumference of auxiliary conduction region H is required. The modified-H-shaped auxiliary conduction region H has a small area and a short circumference compared with the auxiliary conduction region H of the conventional conduction region H shown in FIG. 5, thereby reducing the total capacitance of the main bit lines and thus obtaining high speed reading.

As described above, in the semiconductor memory device of the present invention, an increase in chip size is prevented; the channel widths of the bank select transistors are broad and uniform; and the bank select transistors have large and constant current supply capacitances. Therefore, the semiconductor memory device provides stable high-speed reading.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device comprising:
    a semiconductor substrate;
    a plurality of word lines provided on the semiconductor substrate and arranged in parallel to each other;
    a plurality of memory cells provided along each of the plurality of word lines;
    a plurality of sub bit lines provided on the semiconductor substrate and arranged in parallel to each other, each of the word lines intersecting the plurality of sub bit lines;
    a plurality of main bit lines arranged in parallel to the plurality of sub bit lines;
    a plurality of bank select lines arranged in parallel to the plurality of word lines;
    a plurality of bank select transistors provided along each of the bank select lines and connected to respective ones of the sub bit lines; and
    a plurality of auxiliary conduction regions providing at least one auxiliary conduction region for each of the main bit lines, connecting each of the main bit lines to a set of the plurality of bank select lines,
    wherein:
    each of the auxiliary conduction regions has a modified-H shape including a central portion connected to at least one of the main bit lines and branch portions each connected to a corresponding different bank select line of the set of the plurality of bank select lines; and
    the shape of a bank select transistor along a first bank select line is the same as the shape of a bank select transistor along a second bank select line, the first bank select line and the second bank select line being adjacent and on a same side of at least one central portion of at least one of the plurality of auxiliary conduction regions.

2. A semiconductor memory device according to claim 1, wherein the semiconductor substrate is of a first conductivity type and the plurality of sub bit lines are a second conductivity type diffusion layer.

3. A semiconductor memory device according to claim 1, wherein each of the plurality of memory cells has one of the plurality of sub bit lines as a source and a drain and one of the plurality of word lines as a gate electrode.

4. A semiconductor memory device according to claim 1, wherein each of the plurality of main bit lines is made of a low resistance metal material.

5. A semiconductor memory device according to claim 1, wherein each of the plurality of auxiliary conduction regions has four branch portions.

6. A semiconductor memory device according to claim 5, wherein two of the four branch portions are smaller than the others.

7. A semiconductor memory device comprising:
    a semiconductor substrate;
    a plurality of word lines provided on the semiconductor substrate and arranged in parallel to each other;
    a plurality of memory cells provided along each of the plurality of word lines;
    a plurality of sub bit lines provided on the semiconductor substrate and arranged in parallel to each, other each of the plurality of word lines intersecting the plurality of sub bit lines;
    a plurality of main bit lines arranged in parallel to the plurality of sub bit lines;
    a plurality of bank select lines arranged in parallel to the plurality of word lines;
    a plurality of bank select transistors having the same shape as each other and being provided along each of the plurality of bank select lines and connected to respective ones of the plurality of sub bit lines; and
    a plurality of auxiliary conduction regions provided for each of the plurality of the main bit lines and having central portions, the plurality of auxiliary conduction regions connecting each of the plurality of the main bit lines to a set of the plurality of sub bit lines,
    wherein:
    the plurality of bank select transistors provided along one of the plurality of bank select lines and the plurality of bank select transistors provided along another of the plurality of bank select lines disposed adjacent to the one of the plurality of bank select lines are alternately arranged and protrude inwardly between the one and another of the plurality of bank select lines, the one and another of the plurality of bank select lines being on the same side of at least one of the central portions.

8. A semiconductor memory device according to claim 7, wherein the semiconductor substrate is of a first conductivity type and the plurality of sub bit lines are a second conductivity type diffusion layer.

9. A semiconductor memory device according to claim 7, wherein each of the plurality of memory cells has one of the plurality of sub bit lines as a source and a drain and one of the plurality of word lines as a gate electrode.

10. A semiconductor memory device according to claim 7, wherein each of the plurality of main bit lines is made of a low resistance metal material.

* * * * *